United States Patent
Minning et al.

[11] Patent Number: 5,847,927
[45] Date of Patent: Dec. 8, 1998

[54] ELECTRONIC ASSEMBLY WITH POROUS HEAT EXCHANGER AND ORIFICE PLATE

[75] Inventors: Charles P. Minning, S. Pasadena; Douglas W. Wolfe, La Habra Heights; John H. Schroeder, Redondo Beach, all of Calif.

[73] Assignee: Raytheon Company, El Segundo, Calif.

[21] Appl. No.: 789,678

[22] Filed: Jan. 27, 1997

[51] Int. Cl.⁶ ........................................... H05K 7/20
[52] U.S. Cl. ................... 361/696; 165/80.3; 165/907; 361/708
[58] Field of Search ................... 428/195, 610, 428/613, 614, 620, 665; 165/80.3, 80.4, 185, 104.33, 907; 62/259.2; 174/252, 16.3; 257/712–714, 721–725; 361/690–696, 701, 710, 704–708, 713, 715–722, 729, 730, 733, 735, 752, 796, 803, 784, 785, 790

[56] References Cited

U.S. PATENT DOCUMENTS

| | | | |
|---|---|---|---|
| 5,224,030 | 6/1993 | Banks | 361/386 |
| 5,251,099 | 10/1993 | Goss | 361/721 |
| 5,297,006 | 3/1994 | Muzikoshi | 361/704 |
| 5,322,116 | 6/1994 | Galloway | 165/133 |
| 5,495,126 | 2/1996 | Iguchi | 361/708 |
| 5,561,321 | 10/1996 | Hirano | 257/700 |
| 5,699,234 | 12/1997 | Saia | 361/790 |

FOREIGN PATENT DOCUMENTS

| | | | |
|---|---|---|---|
| 13 00303 | 6/1992 | France | 165/907 |
| 4-143526 | 5/1992 | Japan | 165/907 |

*Primary Examiner*—Gerald P. Tolin
*Attorney, Agent, or Firm*—Colin M. Raufer; Leonard A. Alkov; Glenn H. Lenzen, Jr.

[57] ABSTRACT

An electronic substrate is formed of a porous planar heat exchanger and an orifice plate overlying and thermally contacting the heat exchanger. The orifice plate has a plurality of apertures therethrough. An electronic device is mounted to the orifice plate. A coolant such as air or other gas is forced through the heat exchanger and the apertures of the orifice plate to remove heat that is generated by the electronic device. Preferably, at least two of the assemblies formed of the substrate and the mounted electronic device are mounted in a facing relationship to form a multichip module. A housing is provided to support the assemblies and to channel the flow of coolant through the substrates. Electrical interconnection between the components is provided by a peripheral ring with electrically conducting paths therethrough, which ring extends between the facing substrates.

22 Claims, 6 Drawing Sheets

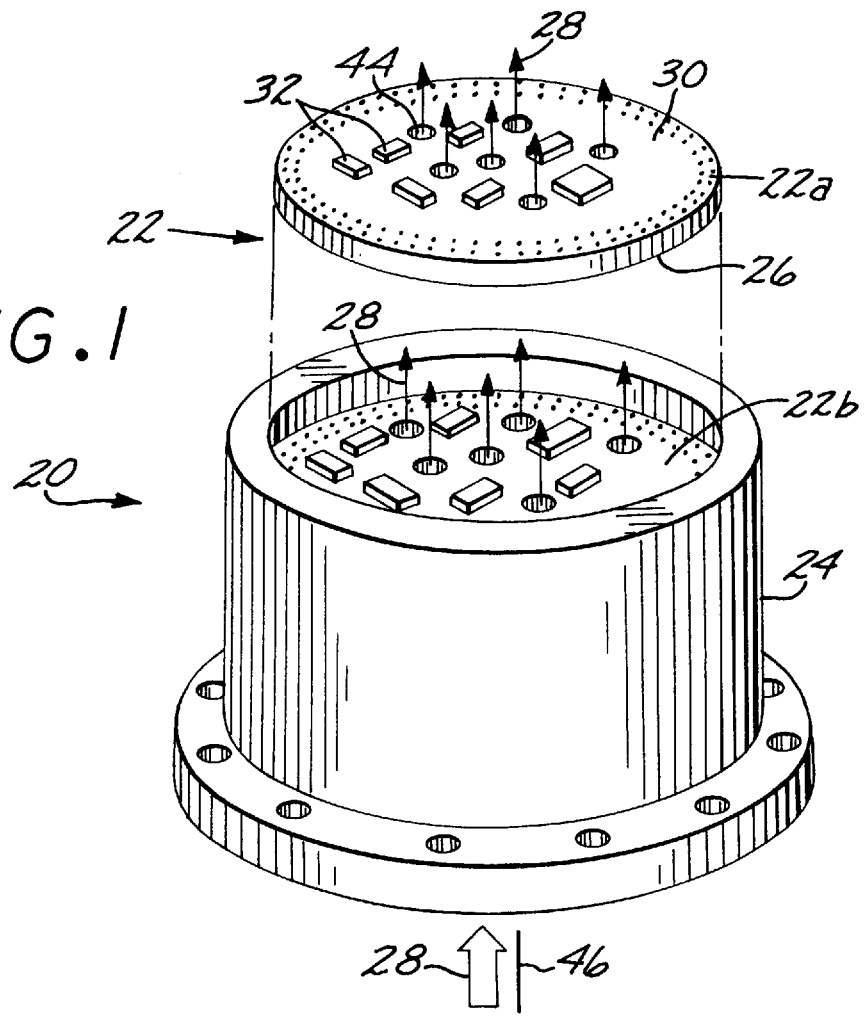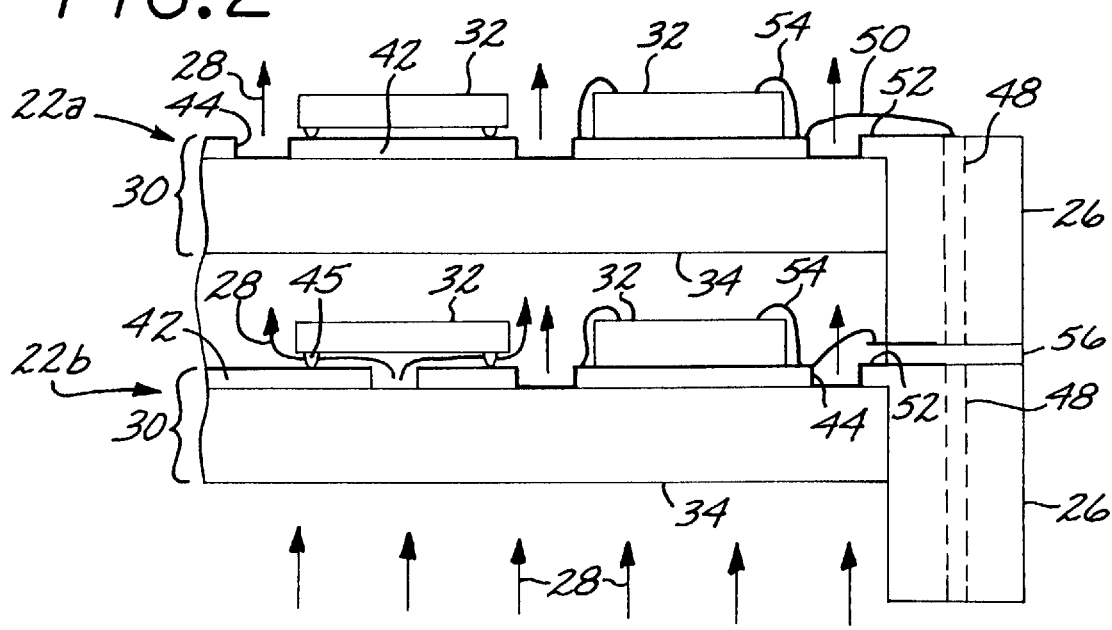

ELECTRONIC ASSEMBLY WITH POROUS HEAT EXCHANGER AND ORIFICE PLATE

BACKGROUND OF THE INVENTION

This invention relates to electronic assemblies, and, more particularly, to a support and package structure for such assemblies that achieves high heat dissipation rates.

A major challenge in the design of complex electronic devices such as specialized computers and controllers is to provide ever-more-powerful and more-complex electronic circuitry in small packages. The small packages result in reduced weight and size, and increased operating speed. Great advances have been made in microelectronic fabrication techniques that permit large numbers of circuit elements to be fabricated onto individual chips, which are in turn attached to a support structure. However, the further miniaturization of many electronic components is limited not by the microelectronic manufacturing techniques of the chips, but instead by heat dissipation.

The electronic devices generate heat when in operation. As the electronic devices and their support structures are made smaller, the heat production per unit volume is increased. In an example of interest to the inventors, one conventional electronic signal processor using the multiple module architecture common in the 1980s generates about 0.069 watts of heat per cubic centimeter of volume of the electronic device, when in operation. In a projected future electronic signal processor using stacked multichip modules to greatly reduce the size and volume of the device, the electronic signal processor produces 0.33 watts of heat per cubic centimeter of volume, or 4–5 times the volumetric heat loading of the 1980s generation technology.

For an electronic device such as the electronic signal processor to operate properly, the heat produced by the electronic device must be dissipated so that the device remains within its operating temperature limits. A variety of heat removal techniques are known, such as forced air cooling, cooling fins, cooling channels, heat pipes, and the like. While these known approaches are operable in varying degrees, the inventors have projected that the available cooling techniques are not sufficient to maintain future electronic devices such as the multichip electronic signal processor discussed above comfortably within their operating temperature limits.

There is a need for an improved approach for the architecture and structure of electronic devices and their packaging to allow the miniaturization of the structures, yet to maintain the devices within satisfactory operating temperature limits. The present invention fulfills this need, and further provides related advantages.

SUMMARY OF THE INVENTION

The present invention provides an electronic assembly, including the electronic devices, the packaging, and the support structure. The available heat dissipation from the electronic assembly is quite high. This electronic assembly is particularly suitable for use where the volumetric heat loadings of the electronic devices are high, as where the size of the assembly is quite small. The electronic assembly is light, small in size, readily repaired, and rugged, so that it is suitable for a wide variety of civilian and military electronics applications.

In accordance with the invention, an electronic assembly comprises a substrate having a heat exchanger assembly comprising a porous planar heat exchanger, and an orifice plate overlying and thermally contacting the heat exchanger. The orifice plate has a plurality of apertures therethrough. An electronic device is mounted to the substrate.

The porous planar heat exchanger is formed of a porous material such as a foam or fibers of a ceramic material of relatively high thermal conductivity, with silicon carbide being preferred. The porous material provides a high surface area per unit volume for heat exchange. The orifice plate is formed of any suitable material through which apertures may be formed and which has a relatively high thermal conductivity. Metals such as aluminum or ceramics such as aluminum oxide may be used. The orifice plate may be formed of the same material as the heat exchanger, and may be either affixed to or integral with the heat exchanger. The electronic device which produces heat is affixed to or integral with the orifice plate.

In operation, heat produced by the electronic device is conducted to the orifice plate, and thence at least in part to the heat exchanger. A coolant such as a gas or a liquid is forced through the porous heat exchanger and through the apertures of the orifice plate. The coolant is preferably a cooling gas such as air. Heat is exchanged from the porous heat exchanger to the coolant gas, which then passes through the apertures to carry heat away from the electronic assembly. The flow of coolant may also be directed around the electronic device in some configurations.

This approach is desirably employed in a multichip module structure wherein two or more of the electronic assemblies are assembled in a facing but spaced-apart relationship. Each of the assemblies, termed a module in the array, has the layered substrate structure described above. The electronic modules are preferably mounted within a housing that holds them in a fixed relationship and guides the flow of coolant serially through the electronic modules. The electronic modules typically require electrical interconnection therebetween. The electrical interconnection is preferably provided by a ring structure at the periphery of the electronic modules. Electrically conducting paths extend longitudinally through the ring, to provide the inter-module electrical interconnection. This interconnect structure does not interfere with the flow of coolant serially through the modules.

This architecture and structure of the electronic assemblies provides much greater heat dissipation than possible with fins, cooling channels, heat pipes, and other conventional heat-dissipation techniques. Comparative studies have demonstrated that the temperature of the electronic device is much lower when the present approach is used, as compared with prior approaches. Additionally, the pressure drop in the coolant across each module, or across an array of modules, is relatively small. The latter is an important consideration for minimizing the total weight of the system, because a high pressure drop would necessitate the use of relatively large fans, blowers, pumps, or other pressurization sources to drive the flow of the coolant. The coolant can be discarded after use in an open-system version of the present invention. A closed recirculating system with a radiator to remove heat from the coolant may instead be used.

The present invention provides an important advance in the art of electronic assemblies and modules, and their packaging and heat dissipation. It permits the practical utilization of electronic miniaturization technology, resulting in further reductions in weight and volume of required electronic assemblies. The pressure drop across the heat exchanger assembly resulting from the coolant circulation is relatively low, so that a relatively small pressure source may be used. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 1 is a partially exploded view of a multichip module and its housing;

FIG. 2 is a schematic sectional view of two modules of the structure of FIG. 1;

DETAILED DESCRIPTION OF THE INVENTION

Figure 3A:
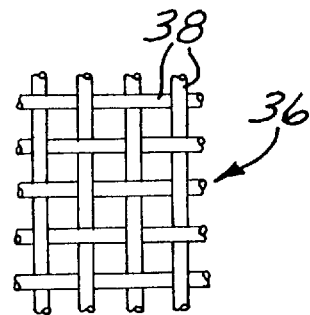
FIG. 3A is a plan view of a first embodiment of the porous planar heat exchanger.

FIG. 1 illustrates a multichip module assembly 20 utilizing the approach of the invention. The multichip module assembly 20 includes at least one, and preferably a plurality of, generally planar modules 22 supported within a housing 24. Each of the modules, such as modules 22a and 22b, is separated by a peripheral ring 26. A gaseous or liquid coolant is forced through the interior of the housing by an appropriate type of blower, fan, or pump, the flow of coolant being indicated schematically at numeral 28. The flow of the coolant is generally perpendicular to the plane of the module assemblies.

FIG. 2 shows two of the modules 22a and 22b in greater detail, as well as their interconnection. The modules are generally planar, with electronic components mounted thereto. Each of the modules includes a substrate 30 with one or more electronic devices 32 mounted thereto. The electronic devices 32 may be active or passive, integrated circuits or discrete components, or any other operable form of device. The several electronic devices 32 on any one module may be interconnected by traces, wirebonds, plug connectors, bump connectors, or any operable form of interconnector, some of which will be discussed in greater detail in relation to FIGS. 11–14. The present invention is not concerned with the specific type of electronic devices and structures that are used, and is suitable for a wide range of such devices.

The substrate 30 has at least two layers, which together comprise a heat exchanger assembly. The first layer is a heat exchanger 34 formed of a porous solid material that permits the passage therethrough of a coolant such as a gas, most preferably air, with minimal flow resistance and pressure drop. The heat exchanger 34 is preferably in the form of a layer made of the porous material. When the module 22 is in operation, the electronic device 32 produces heat. The heat is conducted to the heat exchanger 34. The flow of air or other gaseous or liquid coolant through the porous structure of the heat exchanger transfers the heat into the flow of coolant, and the heat is carried away with the flow of coolant.

Figure 4:
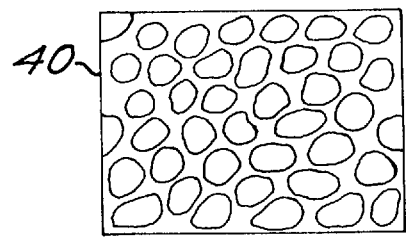
FIG. 4 is a side elevational view of a second embodiment of the porous planar heat exchanger.
Figure 5:
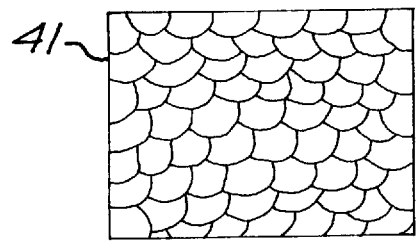
FIG. 5 is a side elevational view of a third embodiment of the porous planar heat exchanger.

The heat exchanger 34 is desirably made porous by virtue of the nature of the material of construction. Any operable porous material may be used for the heat exchanger. FIGS. 3–5 illustrate three types of heat exchanger materials, with that of FIG. 5 being more preferred.

Figure 3B:
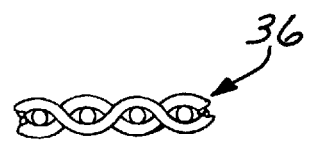
FIG. 3B is a side elevational view of the first embodiment of the porous planar heat exchanger.

The porous material of the heat exchanger as seen in FIGS. 3A–3B is a mat 36 formed of a plurality of spaced-apart fibers 36. The mat 36 may be woven or unwoven, but is preferably woven for structural stability and moderate strength, as illustrated, and then sintered lightly for strength. The fibers 36 may be made of any suitable material, but is preferably a ceramic material of relatively high thermal conductivity. The fibers 36 are most preferably silicon carbide fibers of any diameter, but may also be made of aluminum oxide, aluminum nitride, or beryllium oxide. It is possible, but not preferred, to use metallic fibers such as aluminum or copper fibers. The structure of the mat 36 provides a high ratio of surface area to volume, a desirable feature for a heat exchanger. The mat 36 preferably has a volume fraction of open space (porosity) of from about 0.7 to about 0.9. If the volume fraction of porosity is smaller than about 0.7, the efficiency of the heat exchanger is too small. If the volume fraction of porosity is higher than about 0.9, the heat exchanger material becomes structurally unstable. The mat 36 desirably has a surface-to-volume ratio of at least about $1 \times 10^4$ square centimeters per cubic centimeter, in order to achieve efficient heat exchange.

The porous material of the heat exchanger 34 may be of other forms as well. FIG. 4 illustrates an open-celled sintered structure 40, made of sintered fibers or particles of the same materials as discussed in relation to the mat structure. This material is also porous so that the flow of coolant may pas therethrough. This sintered structure is less desired than the mat structure of FIG. 3, because it is more difficult to make a heat exchanger of relatively high, controlled porosity.

The porous material of the heat exchanger may also be a foam 41 having open-celled porosity, as schematically illustrated in FIG. 5. The foam 41 is made of any of the types of materials discussed previously. For example, open-celled silicon carbide foams are commonly available for use in other applications.

The second layer of the heat exchanger assembly of the substrate 30 is an orifice plate 42. The orifice plate is a flat plate made of any suitable material of good to excellent thermal conductivity, such as a metal or a ceramic. Ceramics are most preferred, as they provide a degree of electrical insulation between adjacent devices 32. The preferred metal is aluminum, and the preferred ceramics are silicon carbide, aluminum oxide, aluminum nitride and beryllium oxide. Diamond may also be used as the orifice plate. The orifice plate 42 overlies and is in thermal communication with the heat exchanger 34, to ensure good heat flow from the orifice plate 42 into the heat exchanger 34 during operation.

The orifice plate 42 and the heat exchanger 34 may be fabricated separately, of the same or different materials of construction, and joined together, or they may be fabricated as a single integral unit. Where they are fabricated separately, the orifice plate 42 is preferably joined to the heat exchanger 34 by a thermally conductive heat sink compound such as a silicone that is filled with a heat conductor such as aluminum oxide. Where they are fabricated integrally, the orifice plate is typically formed as a surface region of the heat exchanger material. For example, an upper surface of a silicon carbide foam material may be densified by deposition of additional silicon carbide material into the upper layer of the foam, as by chemical vapor deposition. Thereafter the apertures (discussed next) are formed through only the densified portion of the silicon carbide material.

The orifice plate 42 includes a number of apertures 44 therethrough. Coolant that flows through the heat exchanger 34 thereafter flows through the apertures 44 of the orifice plate 42 and thence away from the module 22. Although there is some heat transfer from the orifice plate 42 to the coolant flow 28, the great majority of the heat transfer to the coolant flow occurs in the heat exchanger 34. The electronic devices 32 mount to the side of the orifice plate 42 remote from the heat exchanger 34, and in thermal communication therewith, in the regions intermediate the apertures 44.

In one technology, termed "flip-chips", the electronic devices are mounted in an inverted fashion and connected to a trace pattern on the substrate using bump connectors 45. These flip-chip electronic devices 32 may be mounted overlying the apertures 44 in some cases, so that the flow of coolant through the aperture 44 directly contacts the face of the device and removes the heat in a highly efficient manner.

Figure 6:
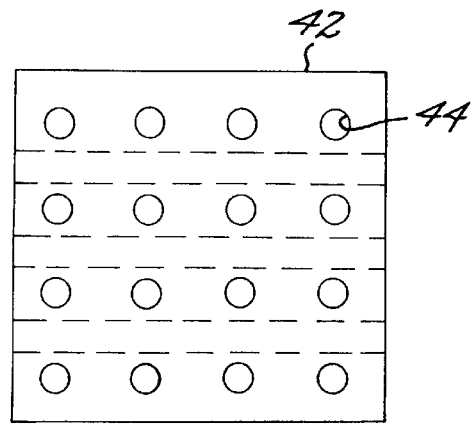
FIG. 6 is a plan view of an embodiment of the orifice plate.

The apertures 44 of the orifice plate 42 may be of any operable size and position. As shown in FIG. 1, the apertures 44 may be irregularly sized and spaced responsive to the layout of the electronic devices. As shown in another embodiment in FIG. 6, the apertures 44 may be regularly arrayed. In all embodiments, it is desirable that the ratio of the area of the apertures 44 to the total area of the orifice plate 42 be as large as possible, constrained by the requirement of sufficient space for mounting of the devices 32 and running electrical interconnects between them, so as to reduce the flow resistance to the coolant and thence the pressure drop in the coolant across the substrate 30. Reduction of the pressure drop reduces the size of the fan, blower, pump, or other pressure source that drives the flow of the coolant.

In the preferred embodiment as shown in FIGS. 1–2, two or more of the modules 22a and 22b are assembled in a facing-but-spaced-apart relationship within the housing 24. The modules 22a and 22b are spaced apart along a longitudinal flow axis 46 of the housing 24. In FIG. 1, the modules 22 and the housing 24 are illustrated as cylindrical, but they may instead be square, rectangular, or any operable shape.

Electrical interconnections between adjacent devices 32 on any one module 22 are made by conventional approaches such as trace patterns, wirebonds, or plug connectors. However, it is necessary in many cases to provide electrical interconnections between the adjacent modules 22a and 22b. The peripheral ring 26 placed between each pair of adjacent modules 22a and 22b positions the modules within the housing 24 and holds the modules in the desired spaced-apart relationship, electrically insulates the modules from each other except for intended electrical interconnections, and also provides electrical interconnections between the adjacent modules. The ring 26 contacts the substrate 30 only near and at its periphery, as shown in FIG. 2, so that the ring does not interfere with the flow of coolant through the substrate. The ring 26 is preferably made of an electrically nonconducting material such as a ceramic, and is most preferably aluminum oxide. The thickness of the ring in the longitudinal axis 46 selected to space the adjacent modules apart by whatever distance is required for clearance of the devices 32 mounted onto the face of each module.

Electrically conductive paths are provided as needed between adjacent modules 22a and 22b, through the ring 26 and related elements. In a preferred approach, the ring 26 has a plurality of vias 48 therethrough extending parallel to the longitudinal axis 46. The vias 48 are tubular openings that are filled with an electrical conductor such as a metal by vapor deposition or other operable technique. As many vias as required are provided to made the necessary inter-module interconnects. Aluminum is the preferred metal that fills the tubular openings. Electrical interconnection between the ends of the vias and the devices 32 is provided by wirebonds 50 or by trace patterns 52 on the upper surface of the orifice plate 42 that extend to pads to which wirebonds 54 to the electrical devices 32 are bonded.

To provide the remainder of the electrically conductive path and to provide a seal against leakage of the coolant, an anisotropically electrically conducting gasket 56 is placed between the longitudinally adjacent rings 26. The gasket is electrically conductive parallel to the longitudinal axis 46, but is electrically nonconductive in other directions including the circumferential and radial directions. Such gaskets are available commercially from AT&T, Fuji Electric, and other companies. The gasket also cushions and distributes any shock or loads introduced into the system, reducing the likelihood of failure of the ceramic components of the system. An initially pliable adhesive with comparable properties may be used as the gasket.

Figure 7:
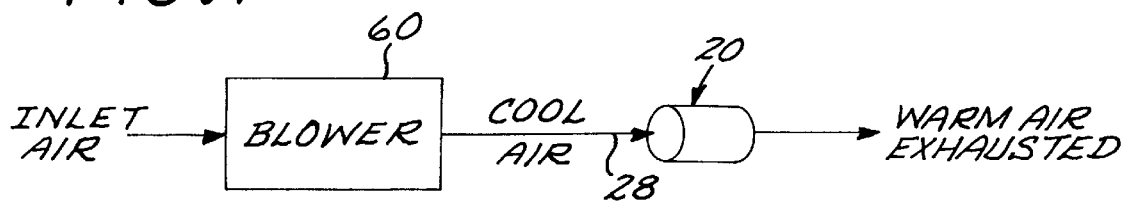
FIG. 7 is a schematic diagram of an open-cycle cooling system.
Figure 8:
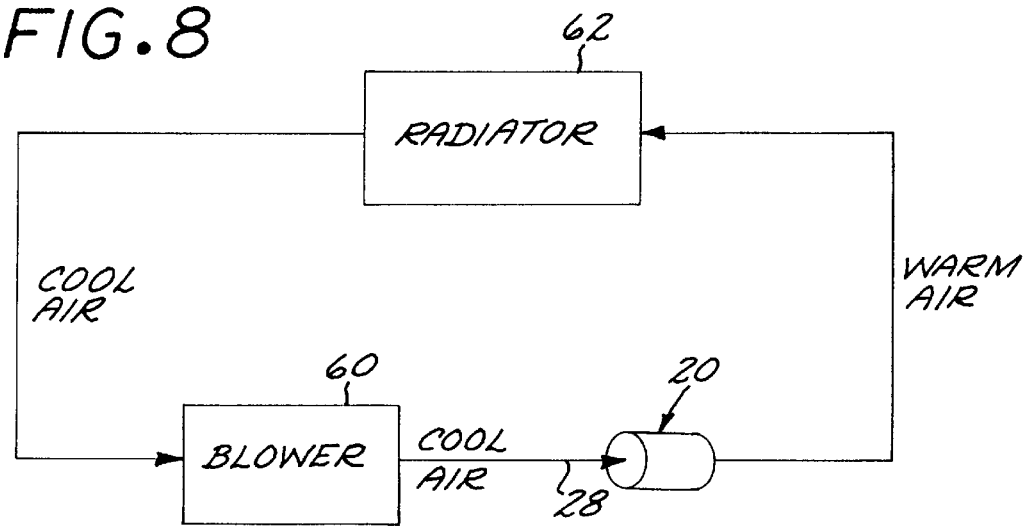
FIG. 8 is a schematic diagram of a closed-cycle cooling system.

In service and when using air or other gas as a coolant, the multichip module assembly 20 is connected to the high-pressure end of a pressure source such as a blower 60, as shown in FIGS. 7–8, to provide the coolant flow 28. The pressure may be as required, but the inventors have obtained excellent results with 30 psi (pounds per square inch) air. Any other appropriate and operable high pressure source may be used instead of the blower, such as a fan, a pump, of a pressurized gas bottle. (In FIGS. 1–2, the coolant is illustrated as flowing through the heat exchanger 34 first, and thereafter through the orifice plate 42. This flow may be reversed as desired, with the coolant first flowing through the orifice plate 42 and thereafter through the heat exchanger 34.) The cooling circuit may be an open circuit, where fresh air is drawn into the blower and the warm air from the multichip module assembly 20 is exhausted. The cooling circuit may instead be a closed circuit, where the warm air from the multichip module assembly 20 is conducted to a radiator 62 (or other type of external heat exchanger, not to be confused with the heat exchanger 34). The cool air leaving the radiator 62 flows to the inlet of the blower 60 and thence back to the multichip module assembly 20 as the coolant flow 28. The open cooling circuit would typically be used for avionics applications, and the closed cooling circuit would typically be used for spacecraft applications. Gases have improved thermal conductivity with increasing pressure. In some applications where maximum heat dissipation is required, means such as an overly large blower 60 is provided to pressurize the gas within the circuits of FIGS. 7 or 8 to a total pressure greater than the differential pressure driving force required to drive the gas through the heat exchanger assembly. However, the use of such pressurization increases the system weight.

A simulated module 22 was built to test the operability of the present approach. The module 22 included a silicon carbide heat exchanger 34 of the type illustrated in FIGS. 3–4, made of a woven mat of 0.003 inch diameter silicon carbide fibers. The heat exchanger was a square 4 inches on a side and 0.1 inches thick. The porosity of the heat exchanger material was 90 percent, and the ratio of surface area to volume was $3 \times 10^4$ square inches per cubic inch. The orifice plate 42 was aluminum with a thickness of 0.030 inches. Different orifice plates were used with different aperture sizes and arrangements to study the effect of the use of different apertures, but in all cases the ratio of the aperture area to the total area was 0.1. The orifice plate 42 was joined to the heat exchanger 34 with Dow Corning 340 heat sink compound, to promote good thermal communication from the orifice plate to the heat exchanger. Six controllable electrical resistance patch heaters were bonded to the surface of the orifice plate 42 remote from the heat exchanger 34. A thin layer of polyimide sheet was placed over that portion of the face of the orifice plate not contacting the heat exchanger and not covered by the patch heaters in order to reduce convective heat dissipation and give more accurate thermal information, although such a cover would not be used in a production device. The patch heaters were used instead of electrical devices in order to study the effects of differing levels of heat generation. The temperature was measured at various locations using thermocouples. The assembly was placed into an air flow chamber to simulate the blower 60, and insulated from its walls.

Figure 9:
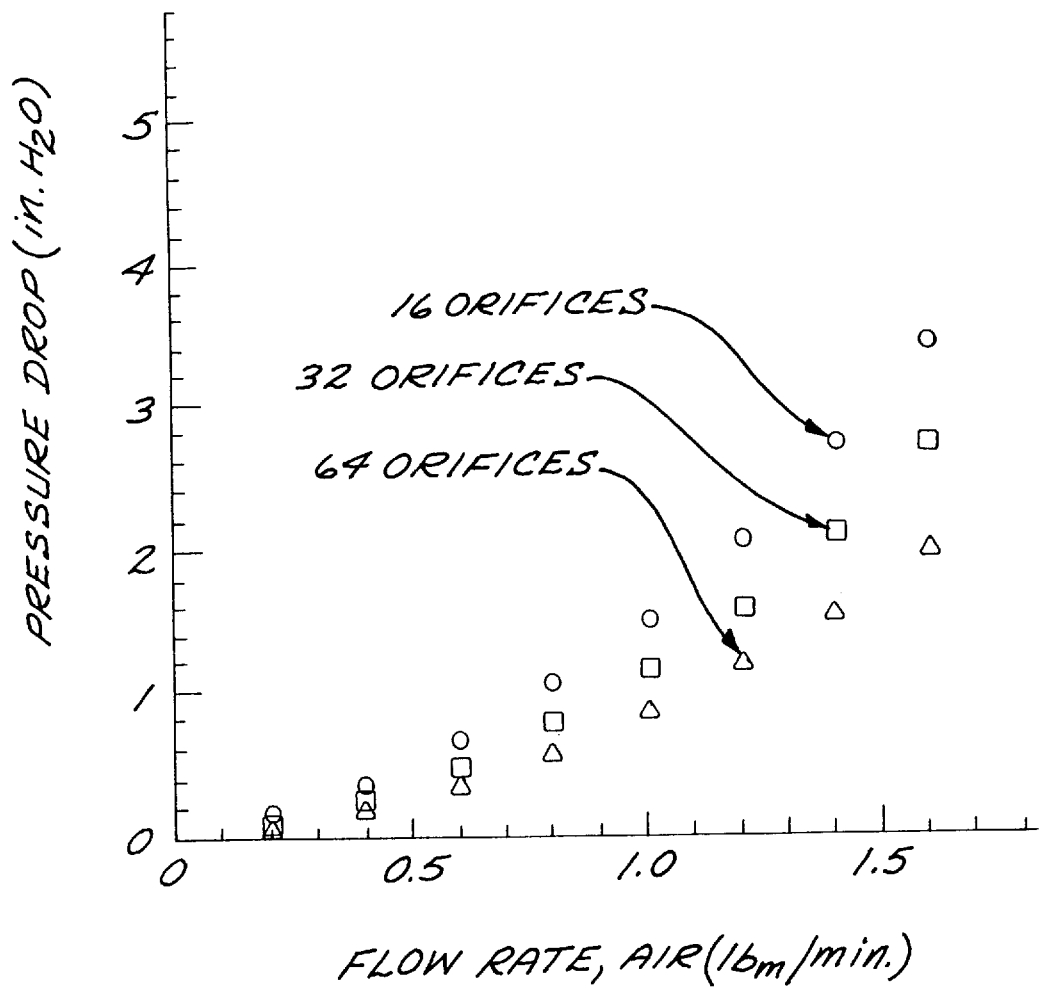
FIG. 9 is a graph of pressure drop as a function of flow rate of coolant.

FIG. 9 is a graph of pressure drop across the simulated device as a function of flow rate of the air in the chamber. The use of a larger number of smaller apertures produces more uniform flow and the lowest pressure drop. In an actual working module, therefore, it is preferred to have a large number of small apertures, rather than a small number of large apertures.

Figure 10:
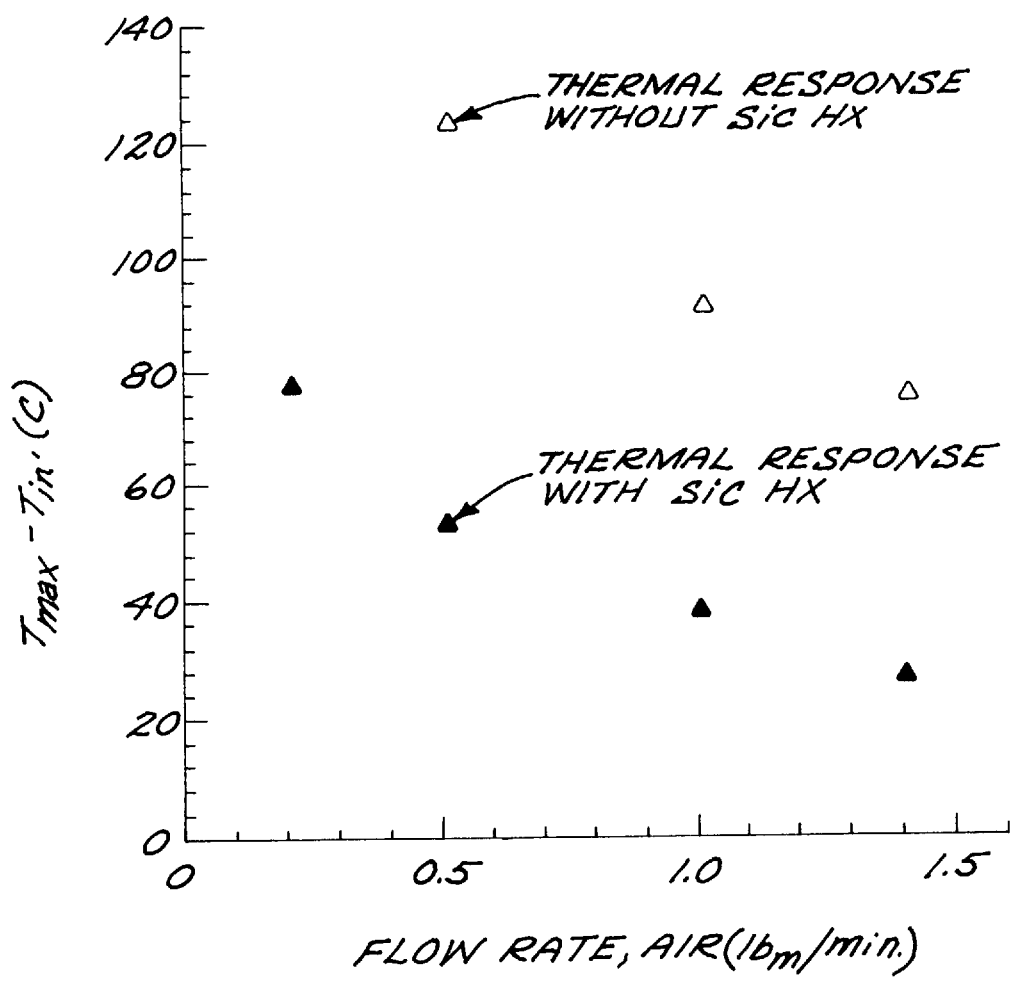
FIG. 10 is a graph of temperature as a function of flow rate of coolant.

The maximum temperature of the substrate was measured with the patch heaters operating to produce varying power dissipation rates. FIG. 10 is a graph of the maximum temperature as a function of the flow rate of the coolant, for a power dissipation of 80 watts. Also shown are comparative data points when the heat exchanger is absent. The use of the porous heat exchanger greatly reduces the maximum temperature under flow conditions.

An analytical study was performed to compare surface temperature reached in a module according to the present approach with a conventional avionics module formed of aluminum fin stock brazed between two thin aluminum face sheets. This conventional module has a power dissipation of 0.17 watts per cubic centimeter, as compared with a power dissipation of 0.33 watts per cubic centimeter for a comparable device made according to the present approach. The power dissipation was 85 watts for both devices. For comparable pressure drops of the coolant of about 2 centimeters of water, the maximum heat exchanger surface temperature reached for the conventional unit is estimated to be 50° C., while the maximum heat exchanger surface temperature reached for the multichip module of the present invention is about 31° C. Thus, the present approach achieves a greatly reduced surface temperature for the electronic device.

The present invention is compatible with a wide variety of advanced intra-module interconnect technologies, four of which are illustrated by way of example in FIGS. 11–14. All of the layers/sublayer approaches of FIGS. 11–14 describe patterned electrical interconnect layers that are provided on the substrate and joined to the orifice plate. Each of these figures illustrates a substrate 30 having a heat exchanger 34, orifice plate 42, and aperture 44 through the orifice plate, as described previously. An electronic device 32 is attached to each substrate 30. These elements are as described previously.

Figure 11:
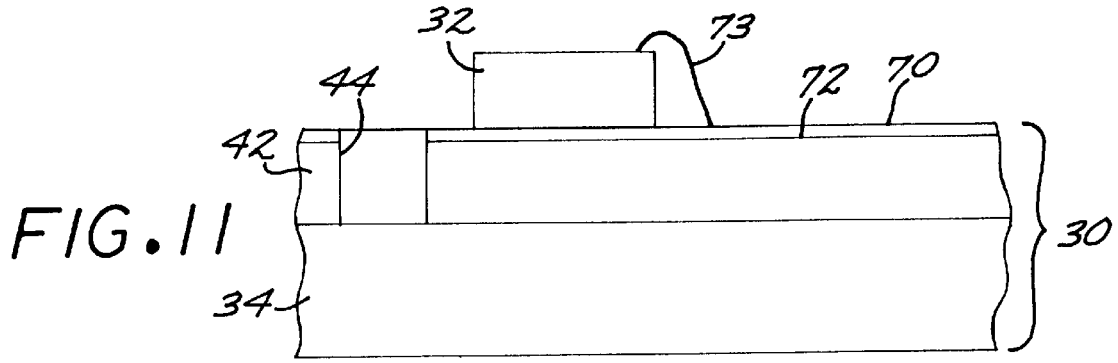
FIG. 11 is a schematic sectional view of a first embodiment of an electronic assembly having a patterned electrical interconnect layer.

In the approach of FIG. 11, a patterned electrical interconnect layer 70 is deposited onto an upper surface 72 (which is remote from the heat exchanger 34) of the orifice plate 42. The term "patterned layer" is used in the conventional manner of the art, meaning a layer having electrically conductive traces embedded in or overlying an electrically nonconducting material. The pattern of the traces is selected to provide the required electrical interconnects between circuit elements such as the device 32. The patterned layer is formed into the surface of the orifice place by conventional microelectronic techniques such as etching and deposition. Where the orifice plate is made of an electrical nonconductor, the pattern of traces may be formed directly onto the orifice plate. If the orifice plate itself has too great an electrical conductivity, a layer of an electrical nonconductor material may first be deposited onto its upper surface and thereafter a pattern of electrical conductor traces deposited. Electrical interconnection between the metallic portion of the layer 70 and the device 32 is accomplished by wirebonds 73 or other operable approach.

Figure 12:
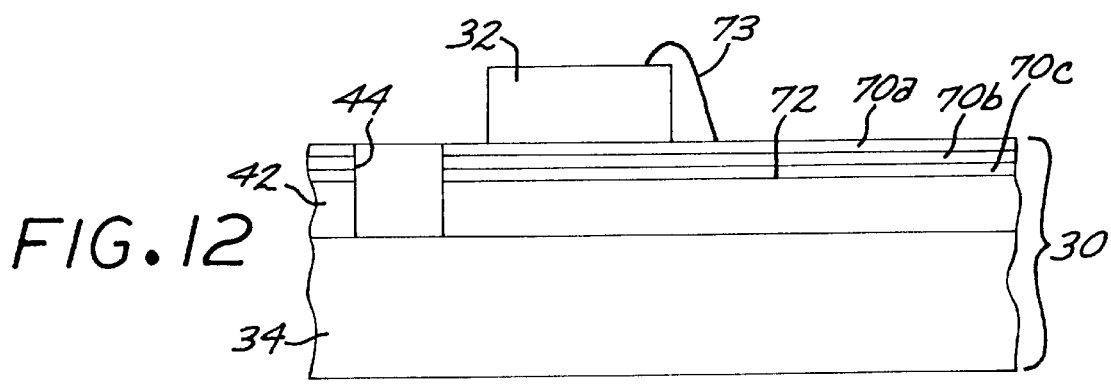
FIG. 12 is a schematic selectional view of a second embodiment of an electronic assembly having a patterned electrical interconnect layer.
Figure 13:
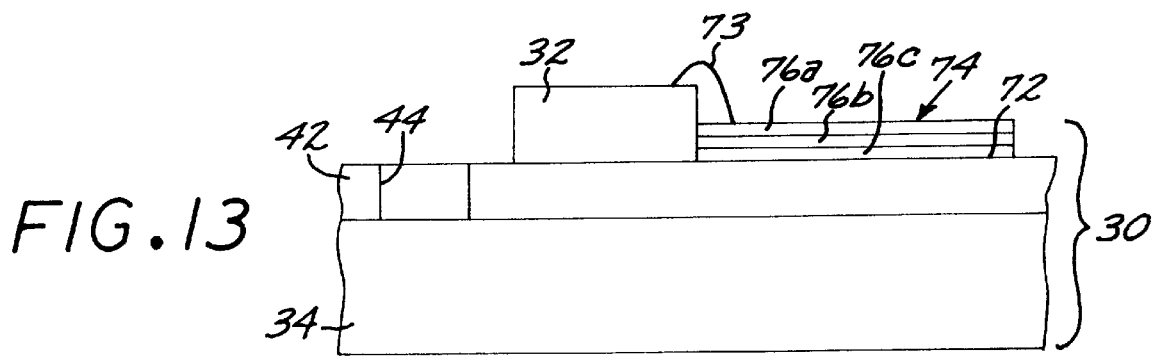
FIG. 13 is a schematic sectional view of a third embodiment of an electronic assembly having a patterned electrical interconnect layer.

In many complex electronic assemblies, a single patterned electrical interconnect layer is insufficient, and multiple patterned sublayers are necessary. FIG. 12 illustrates a multi-sublayer electrical interconnect layer 70. The sublayers 70a, 70b, and 70c are sequentially deposited onto the upper surface 72 of the orifice plate 42 and patterned by etching and deposition techniques. Electrical interconnects between the device 32 and the metal traces on the sublayers 70a, 70b, and 70c are accomplished using wirebonds 73 or other operable approach. By providing interconnect pads or openings extending through the overlying sublayers, electrical interconnections may be made from the device 32 to any of the sublayers 70a, 70b, and 70c. As many sublayers may be provided as necessary.

In some cases, it is more convenient to provide the electrical interconnect layer after the orifice plate 42 is fully fabricated. In one approach, illustrated in FIG. 13, a decal 74 is fabricated and applied to the upper surface 72 of the orifice plate 42. The decal 74 is prepared in a separate operation and has multiple patterned sublayers 76a, 76b, and 76c. As many sublayers may be provided as necessary. The decal is adhered to the upper surface 72 using an adhesive. Electrical interconnects between the device 32 and the metal traces on the sublayers 76a, 76b, and 76c are accomplished using wirebonds 73 or other operable approach. By providing interconnect pads or openings extending through the overlying decal sublayers, electrical interconnections may be made from the device 32 to any of the decal sublayers 76a, 76b, and 76c. The use of the decal has the advantage that the electrical nonconductor may be an organic material.

Figure 14:
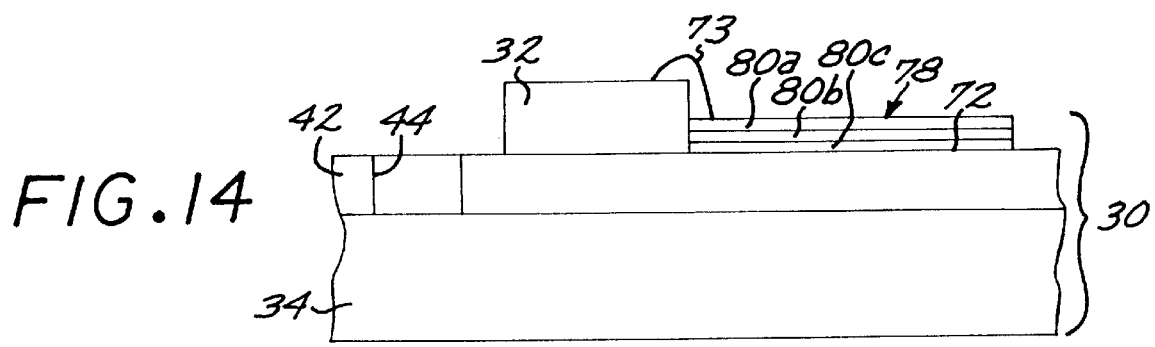
FIG. 14 is a schematic sectional view of a fourth embodiment of an electronic assembly having a patterned electrical interconnect layer.

In an approach somewhat similar to the decal and illustrated in FIG. 14, a laminated flex circuit 78 is prepared by laminating together individual flex circuit sublayers 80*a*, 80*b*, and 80*c*, and then bonding the laminated flex circuit 78 to the upper surface 72 of the orifice plate 42 with a suitable adhesive. As many flex circuit sublayers may be provided as necessary. By providing interconnect pads or openings extending through the overlying flex circuit sublayers, electrical interconnections may be made from the device 32 to any of the flex circuit sublayers 80*a*, 80*b*, and 80*c*. The use of the flex circuit approach has the advantage that the electrical nonconductor may be an organic material and that the individual sublayers 80*a*, 80*b*, and 80*c* may be fabricated separately and then laminated together.

Although particular embodiments of the invention have been described in detail for purposes of illustration, various modifications and enhancements may be made without departing from the spirit and scope of the invention. Accordingly, the invention is not be limited except as by the appended claims.

What is claimed is:

1. An electronic assembly, comprising:
    a substrate having a heat exchanger assembly comprising
       a porous planar heat exchanger, and
       an orifice plate overlying and thermally contacting the heat exchanger, the orifice plate having a plurality of apertures therethrough; and
    an electronic device having electrical contacts mounted to the substrate.

2. The electronic assembly of claim 1, wherein the porous heat exchanger comprises a structure selected from the group consisting of a mat formed of a plurality of spaced fibers, a foamed solid body, and a sintered solid body.

3. The electronic assembly of claim 1, wherein the porous heat exchanger is made of a material selected from the group consisting of silicon carbide, aluminum oxide, aluminum nitride, beryllium oxide, and diamond.

4. The electronic assembly of claim 1, wherein the porous heat exchanger has a surface area per unit volume of at least about $10^4$ square centimeters per cubic centimeter.

5. The electronic assembly of claim 1, wherein the orifice plate is made of a material selected from the group consisting of a metal and a ceramic.

6. The electronic assembly of claim 1, wherein the orifice plate is made of a material selected from the group consisting of aluminum, silicon carbide, aluminum oxide, aluminum nitride, beryllium oxide, and diamond.

7. The electronic assembly of claim 1, wherein the orifice plate is integral with the heat exchanger.

8. The electronic assembly of claim 1, further including
    a second substrate having a second heat exchanger assembly comprising
       a porous planar second heat exchanger, and
       a second orifice plate overlying and thermally contacting the second heat exchanger, the second orifice plate having a second plurality of apertures therethrough; and
    a second electronic device mounted to the second substrate, the second substrate being positioned in a facing but spaced apart relation to the substrate.

9. The electronic assembly of claim 8, further including
    a housing in which the substrate and the second substrate are received and held in the facing but spaced apart relation.

10. The electronic assembly of claim 8, further including means for electrically interconnecting the electronic device mounted to the substrate and the second electronic device mounted to the second substrate.

11. The electronic assembly of claim 10, wherein the means for electrically interconnecting comprises
    a ring of an electrical nonconducting material extending between the substrate and the second substrate, the ring contacting the substrate and the second substrate at their respective peripheries, and
    at least one electrically conducting path extending through the ring between the substrate and the second substrate.

12. The electronic assembly of claim 1, further including means for forcing a flow of coolant through the porous planar heat exchanger and the orifice plate.

13. An electronic assembly, comprising:
    a first substrate comprising
       a porous planar first heat exchanger, and
       a first orifice plate overlying and thermally contacting the first heat exchanger, the first orifice plate having a first plurality of apertures therethrough;
    a first electronic device mounted to the first orifice plate;
    a second substrate comprising
       a porous planar second heat exchanger, and
       a second orifice plate overlying and thermally contacting the second heat exchanger, the second orifice plate having a second plurality of apertures therethrough;
    a second electronic device mounted to the second orifice plate, the second substrate being positioned in a facing but spaced apart relation to the substrate; and
    means for forcing a flow of coolant through the porous planar first heat exchanger and the first orifice plate, and thereafter through the porous planar second heat exchanger and the second orifice plate.

14. The electronic assembly of claim 13, further including a housing in which the first substrate and the second substrate are received and held in the facing but spaced apart relation.

15. The electronic assembly of claim 13, further including means for electrically interconnecting the electronic device mounted to the first substrate and the second electronic device mounted to the second substrate.

16. The electronic assembly of claim 15, wherein the means for electrically interconnecting comprises
    a ring of an electrical nonconducting material extending between the first substrate and the second substrate, the ring contacting the first substrate and the second substrate at their respective peripheries, and
    at least one electrically conducting path extending through the ring between the first substrate and the second substrate.

17. An electronic assembly, comprising:
    a substrate, comprising
       a patterned electrical interconnect layer, and
       a planar heat exchanger assembly, the planar heat exchanger assembly comprising
          an orifice plate having a plurality of apertures therethrough, a first side of the orifice plate being joined to the interconnect layer and
          a porous planar heat exchanger in thermal contact with a second side of the orifice plate;
    an assembly of electronic devices mounted to electrical interconnect layer of the substrate; and
    a plurality of electrical interconnects extending between the assembly of electronic devices and the patterned electrical interconnect layer.

18. The electronic assembly of claim 17, wherein the patterned electrical interconnect layer comprises at least two patterned electrically conductive sublayers.

19. The electronic assembly of claim 17, wherein the patterned electrical interconnect layer comprises at least two flex circuits laminated together.

20. The electronic assembly of claim 17, further including a second substrate spaced apart from but in facing relation to the substrate, the second substrate comprising
 a patterned electrical second interconnect layer, and
 a planar second heat exchanger assembly, the planar second heat exchanger assembly comprising
  a second orifice plate having a second plurality of apertures therethrough, a first side of the second orifice plate being joined to the second interconnect layer and
  a porous planar second heat exchanger in thermal contact with a second side of the second orifice plate;

a second assembly of electronic devices mounted to electrical second interconnect layer of the second substrate; and a plurality of second electrical interconnects extending between the second assembly of electronic devices and the patterned electrical second interconnect layer.

21. The electronic assembly of claim 17, further including means for producing a differential pressure to force a flow of coolant through the porous planar heat exchanger and the orifice plate.

22. The electronic assembly of claim 21, further including means for increasing the total pressure of the coolant above the differential pressure required to force the flow of coolant through the porous planar heat exchanger and the orifice plate.

* * * * *